(12) United States Patent
Dai

(10) Patent No.: US 11,444,086 B2
(45) Date of Patent: Sep. 13, 2022

(54) CAPACITOR AND ITS FORMATION METHOD AND A DRAM CELL

(71) Applicant: CHANGXIN MEMORY TECHNOLOGIES, INC., Hefei (CN)

(72) Inventor: Chi-Wei Dai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/087,463

(22) Filed: Nov. 2, 2020

(65) Prior Publication Data

US 2021/0074706 A1 Mar. 11, 2021

Related U.S. Application Data

(63) Continuation of application No. PCT/CN2020/076309, filed on Feb. 22, 2020.

(30) Foreign Application Priority Data

Apr. 22, 2019 (CN) .......................... 201910322689.2

(51) Int. Cl.
*H01L 27/108* (2006.01)
*H01L 49/02* (2006.01)

(52) U.S. Cl.
CPC ........ *H01L 27/10808* (2013.01); *H01L 28/87* (2013.01); *H01L 28/88* (2013.01)

(58) Field of Classification Search
None
See application file for complete search history.

(56) References Cited

U.S. PATENT DOCUMENTS

| 2014/0299929 | A1  | 10/2014 | Chumakov et al. |
| 2017/0345886 | A1* | 11/2017 | Yi ..................... H01L 27/10855 |
| 2018/0308923 | A1* | 10/2018 | Wu ........................ H01L 29/94 |
| 2019/0304979 | A1* | 10/2019 | Ahn .................. H01L 29/78642 |
| 2020/0020695 | A1* | 1/2020  | Leobandung ........ G06N 3/0635 |
| 2020/0098853 | A1* | 3/2020  | Haraguchi .......... H01L 23/5226 |
| 2021/0343718 | A1* | 11/2021 | Wang ..................... H01L 23/64 |

FOREIGN PATENT DOCUMENTS

| CN | 107731794 A  | 2/2018 |
| CN | 109065501 A  | 12/2018 |
| CN | 209785930 U  | 12/2019 |
| WO | 2016179025 A1 | 11/2016 |

* cited by examiner

*Primary Examiner* — Steven M Christopher
(74) *Attorney, Agent, or Firm* — Kilpatrick Townsend & Stockton LLP

(57) ABSTRACT

The present invention relates to a capacitor and its formation method and to a DRAM cell. In various embodiments, a substrate is provided such that an electrical contact portion is formed thereon. A dielectric layer is formed on a surface of the substrate, including alternately stacked supporting layers and sacrificial layers. At least two capacitor holes penetrating the sacrificial layers and the supporting layers can formed to expose the same electrical contact portion. A lower electrode layer covering the inner surface of the capacitor holes can be formed. The lower electrode layer is connected to the electrical contact portion. The sacrificial layers are then removed and a capacitor dielectric layer and an upper electrode layer are formed successively on the inner and outer surfaces of the lower electrode layer and on the surface of the supporting layers. This can increase capacitance value per unit area of the capacitor.

9 Claims, 8 Drawing Sheets

CAPACITOR AND ITS FORMATION METHOD AND A DRAM CELL

CROSS REFERENCE

The present disclosure is a continuation of PCT/CN2020/076309, filed on Feb. 22, 2020, which claims priority to Chinese Patent Application No. 201910322689.2, titled "A CAPACITOR AND ITS FORMATION METHOD AND A DRAM CELL" and filed on Apr. 22, 2019, the entire contents of which are incorporated herein by reference.

TECHNICAL FIELD

The present invention relates to the field of semiconductor technology, in particular to a capacitor and its formation method and to a DRAM cell.

BACKGROUND

Dynamic Random Access Memory (DRAM) is a semiconductor memory device commonly used in computers and is composed of many repeated memory cells. Each memory cell is usually composed of a capacitor and a transistor.

With the development of semiconductor technology, increasingly higher requirements are proposed on performance of capacitors in semiconductor integrated circuits, such the requirement to form larger capacitance in a limited area and improve the integration of capacitors. Improved integration of capacitors can lead to improved integration of dynamic memories.

In the prior art, in order to improve integration of capacitors, capacitors are usually designed in a vertical shape to increase the capacitance value per unit area by increasing the height of capacitors. However, capacitors with increased height are prone to collapse.

Therefore, how to effectively improve integration of capacitors is a problem to be solved urgently.

SUMMARY

A technical problem to be solved by the present invention is to provide a capacitor and its formation method to improve integration of the capacitor.

In order to solve the above-mentioned problem, technical solutions proposed as described herein may provide a capacitor formation method including: providing a substrate in which an electrical contact portion is formed; forming alternately stacked supporting layers and sacrificial layers on the surface of the substrate; forming at least two capacitor holes penetrating the sacrificial layers and the supporting layers and exposing the electrical contact portion; forming a lower electrode layer covering the inner surface of the capacitor holes, with the lower electrode layer being connected to the electrical contact portion; removing the sacrificial layers; forming a capacitor dielectric layer and an upper electrode layer successively on the inner and outer surfaces of the lower electrode layer and on the surface of the supporting layers.

In some embodiments, forming the at least two capacitor holes includes: forming a mask layer on the surface of the alternately stacked supporting layers and sacrificial layers; patterning the mask layer so that at least two openings are formed in the mask layer above the electrical contact portion; etching the alternately stacked supporting layers and sacrificial layers to the surface of the electrical contact portion along the openings; and forming the capacitor holes.

In some embodiments, patterning the mask layer includes: performing a doping process on the mask layer to form first portions and second portions arranged at intervals in the mask layer, with the first portions and the second portions having different doping densities and with at least two first portions or two second portions in the mask layer above the electrical contact portion; selectively removing first portions or second portions in the mask layer above the electrical contact portion; and patterning the mask layer.

In some embodiments, patterning the mask layer includes: etching the mask layer and forming a concave portion in the mask layer, with the concave portion located above the electrical contact portion; performing doping process on the concave portion to form first portions and second portions arranged at intervals in the concave portion, with the first portions and the second portions having different doping densities and with at least two first portions or two second portions in the concave portion; selectively removing first portions or second portions in the concave portion and patterning the mask layer.

In some embodiments, forming at least two capacitor holes includes: forming a first mask layer on the surface of the alternately stacked supporting layers and sacrificial layers, etching the first mask layer, and forming a concave portion in the first mask layer with the concave portion located above the electrical contact portion; forming a second mask layer covering the inner surface of the concave portion and the surface of the first mask layer; patterning the second mask layer; forming at least two openings in the second mask layer at the bottom of the concave portion; etching the alternately stacked supporting layers and sacrificial layers to the surface of the electrical contact portion along the openings; and forming the capacitor holes.

In some embodiments, patterning the second mask layer includes: performing a doping process on the second mask layer to form first portions and second portions arranged at intervals in the second mask layer, with the first portions and the second portions having different doping densities and with at least two first portions or two second portions in the second mask layer above the electrical contact portion; selectively removing first portions or second portions in the second mask layer above the electrical contact portion; and patterning the second mask layer.

In some embodiments, the doping process includes adopting two tilted and opposite ion implantation processes.

In some embodiments, the tilt angle of the ion implantation processes ranges from 5° to 45°.

In some embodiments, the size of the concave portion is less than or equal to the size of the electrical contact portion.

The technical solutions in accordance with the disclosure may provide a capacitor comprising: a substrate in which an electrical contact portion is formed; a lower electrode layer which is connected to the electrical contact portion and includes at least two sub-electrode layers arranged at intervals, with the bottom of the sub-electrode layers connected to the electrical contact portion; a capacitor dielectric layer on the inner and outer surfaces of the lower electrode layer; and an upper electrode layer on the surface of the capacitor dielectric layer.

In some embodiments, the cross section of the sub-electrode layers is U-shaped.

In some embodiments, both the capacitor dielectric layer and the upper electrode layer are continuous material layers.

In some embodiments, the capacitor is further composed of a support structure between the sub-electrode layers arranged at intervals which is connected to the sub-electrode layers and on whose inner and outer surfaces the capacitor dielectric layer and the upper electrode layer are formed successively.

In some embodiments, the support structure at least includes: a first supporting layer and a second supporting layer, with the first supporting layer formed on the surface of the substrate and located at the bottom periphery of the lower electrode layer and between two sub-electrode layers, and with the second supporting layer located at the middle periphery of the lower electrode layer and between the two sub-electrode layers.

In order to solve the above-mentioned problem, technical solutions proposed in the present invention also provide a DRAM cell comprising: a transistor with a source area and a drain area which is placed in the substrate, and the capacitor described above which is in contact with the source area or the drain area through the electrical contact portion.

The formation method of capacitors as proposed in the present invention is to form two capacitor holes on the electrical contact portion of the substrate, so as to form two double-sided capacitor structures on the single electrical contact portion to improve the capacitance value per unit area of capacitors. Besides, since the integration of capacitors is greatly improved by forming at least two capacitor holes on a same electrical contact portion, the height of capacitor holes can be appropriately reduced to avoid capacitors from collapsing as long as the requirements on integration of capacitors are met.

Furthermore, the position and size of capacitor holes can be determined by forming at least two first portions or two second portions with different doping densities in the mask layer through doping process and by selectively removing the two first portions or two second portions, which can greatly reduce the size of the capacitor holes and prevent the same from size limitations imposed by the photolithography process and further reduce costs.

DESCRIPTION OF THE EMBODIMENTS

As described in the "BACKGROUND" section above, the integration of capacitors in the prior art is expected to be further improved.

In order to solve the afore-mentioned problem, various embodiments provide a new capacitor and its formation method. For the purpose of further improving integration of capacitors, two or more U-shaped lower electrode layers can be formed in one capacitor and connected to a same electrical contact portion. To form more than two U-shaped lower electrode layers, it is necessary to form more than two capacitor holes on one electrical contact portion, with critical dimensions of the capacitor holes formed being greatly reduced. However, under the current process conditions, it is difficult to form such capacitor holes with greatly reduced critical dimensions through the existing photolithography and etching process. Even though capacitor holes in a smaller size can be formed through the double patterning process, photolithography and etching are required to be done for multiple times, which greatly increases the process cost. The applicant has overcome such problem by proposing a new capacitor and its formation method.

A detailed description is made as follows on various embodiments showing the capacitor and its formation method, the DRAM cell and the memory proposed in the present invention with reference to the accompanying drawings.

FIG. 1 to FIG. 11 are schematic diagrams showing the formation process of a capacitor as described in a specific embodiment of the present invention.

Figure 1:
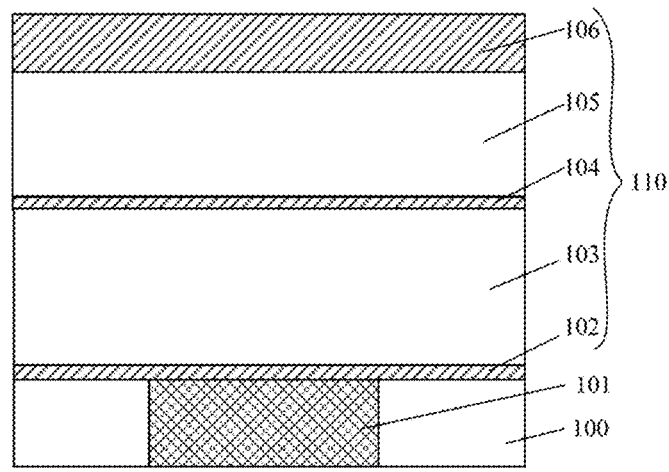
FIG. 1 to FIG. 11 are schematic diagrams showing the formation process of a capacitor as described in a specific embodiment of the present invention.

As shown in FIG. 1, a substrate 100 is provided in which an electrical contact portion 101 is formed; a dielectric layer 110 is formed on the surface of the substrate 100, which comprises alternately stacked supporting layers and sacrificial layers.

Word lines, bit lines, transistors, isolation structures and other structures can also be formed in the substrate 100, which are not shown in the accompanying drawings herein.

The dielectric layer 110 may be formed on the surface of the substrate 100 by using atomic layer deposition process, chemical vapor deposition process and other deposition processes. It should be noted that the dielectric layer 110 comprises alternately stacked supporting layers and sacrificial layers, with the number of the supporting layers greater than the number of the sacrificial layers. Both the bottom material layer and the top material layer in the stacked structure formed by the sacrificial layers and the supporting layers are the supporting layers. The number of the supporting layers and the sacrificial layers can be determined as needed, but is not limited to that described in this specific embodiment.

In this embodiment, the dielectric layer 110 comprises a first supporting layer 102 formed on the surface of the substrate 100, a first sacrificial layer 103 on the surface of the first supporting layer 102, a second supporting layer 104 on the surface of the first sacrificial layer 103, a second sacrificial layer 105 on the surface of the second supporting layer 104, and a third supporting layer 106 on the surface of the second sacrificial layer 105. The materials of which the first supporting layer 102, the second supporting layer 104 and the third supporting layer 106 are made include silicon nitride, and the materials of which the first sacrificial layer 103 and the second sacrificial layer 105 are made include silicon oxide. In other specific embodiments, the number of supporting layers and sacrificial layers can also be increased to increase height of the capacitor and further increase capacitance value of the capacitor. The number of supporting layers can also be appropriately reduced, for example, to only the first supporting layer 102 and the second supporting layer 104.

At least two capacitor holes penetrating the sacrificial layers and the supporting layers and exposing the same electrical contact portion are subsequently formed.

FIG. 2 to FIG. 6B are schematic diagrams of the process structure of forming two capacitor holes in a specific embodiment.

Figure 2:
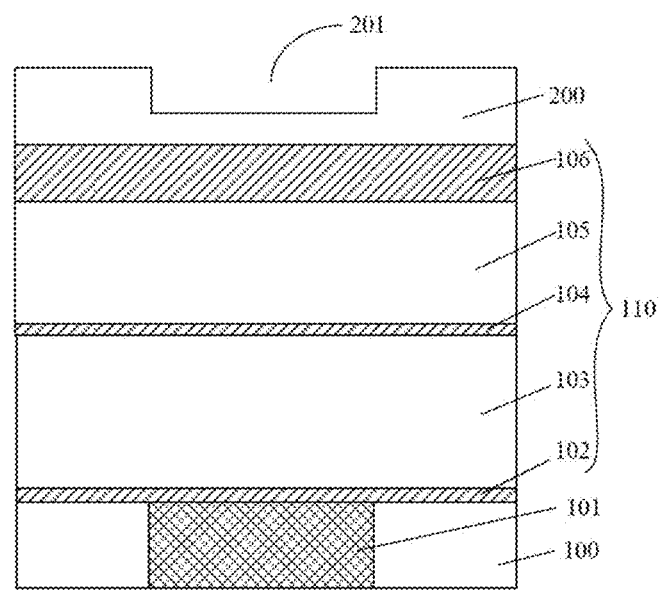

As shown in FIG. 2, a first mask layer 200 is formed on the surface of the dielectric layer 110, and the first mask layer 200 is etched to form a concave portion 201 in the first mask layer 200. The concave portion 201 is above the electrical contact portion 101.

The first mask layer 200 may be made of silicon oxide or any other mask material, and preferably, it is made of the material different from that of the third supporting layer 106 so as to subsequently remove the first mask layer 200.

The shape and size of the concave portion 201 are consistent with that of the electrical contact portion 101. The first mask layer 200 may be etched by using the photomask used in forming the electrical contact portion 101 to form the concave portion 201. In other embodiments, the size of the concave portion 201 may also be smaller than that of the electrical contact portion 101. A capacitor structure is subsequently formed under the concave portion 201 so that the capacitor structure is located on the surface of the electrical contact portion 101.

In this embodiment, a depth of the concave portion 201 is less than the thickness of the first mask layer 200. In other embodiments, the depth of the concave portion 201 may also be equal to the thickness of the first mask layer 200, so that the bottom of the concave portion 201 is located on the surface or inside of the third supporting layer 106.

Figure 3:
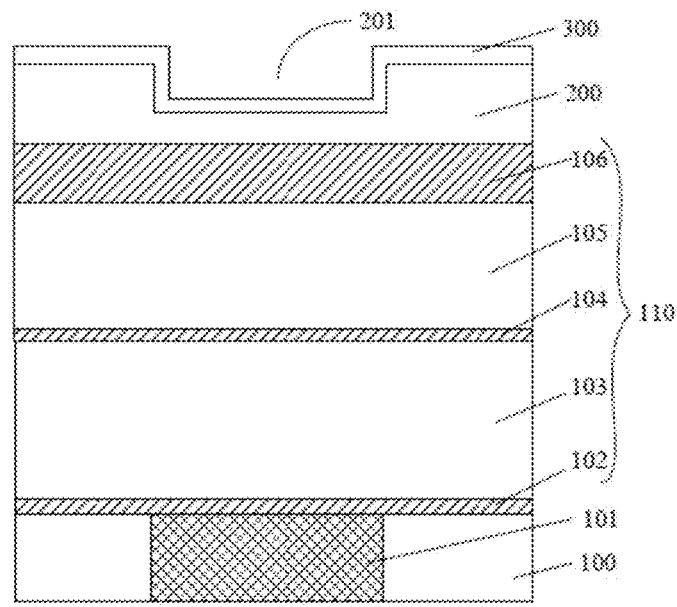

As shown in FIG. 3, a second mask layer 300 covering the inner wall of the concave portion 201 and the surface of the first mask layer 200 is formed.

Etching selectivity can be changed by doping the material of which the second mask layer 300 is made.

In this embodiment, the second mask layer 300 is made of polysilicon, and can be formed by using the atomic layer deposition process or chemical vapor deposition process. In other embodiments, the second mask layer 300 may be made of any other material, which is not limited herein.

The thickness of the second mask layer 300 may be 5 nm-30 nm, which may be adjusted according to tilt angle of the subsequent tilted implantation.

Figure 4:
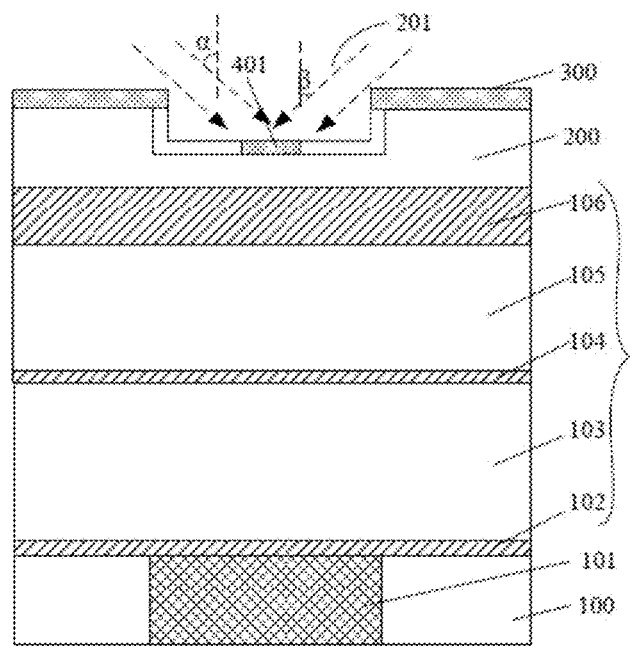

As shown in FIG. 4, a doped area 401 is formed in the middle of the second mask layer 300 at the bottom of the concave portion 201 by using two tilted and opposite ion implantation processes.

The tilt angles of the first ion implantation process and the second ion implantation process are α and β, respectively. Since the sidewalls of the concave portion 201 are shielded, only a part of the second mask layer 300 at the middle position of the bottom of the concave portion 201 can receive the two ion implantations to form a doped area 401. The part of the second mask layer 300 at other positions at the bottom of the concave portion 201 can receive at most one ion implantation, with the doping density less than that of the doped area 401. Therefore, there may be different etching selectivities in the doped area 401 and between both sides of the doped area 401 by selecting a suitable etching process. In the ion implantations, the ions implanted may be P, B, Ga, As, etc. with the implantation conditions including the energy of implanted ions being 10~900 keV and the measurement being $1E11 \sim 1E13/cm^2$.

The doping density of the second mask layer 300 on the surface of the dielectric layer 110 is consistent with that of the doped area 401.

The width of the doped area 401 may be adjusted by adjusting the depth of the concave portion 201 and the tilt angles α and β. In this specific embodiment, α=β; in other specific embodiments, the tilt angle may range from 5° to 45°, and the depth of the concave portion 201 may range from 100 nm to 200 nm.

Figure 5:
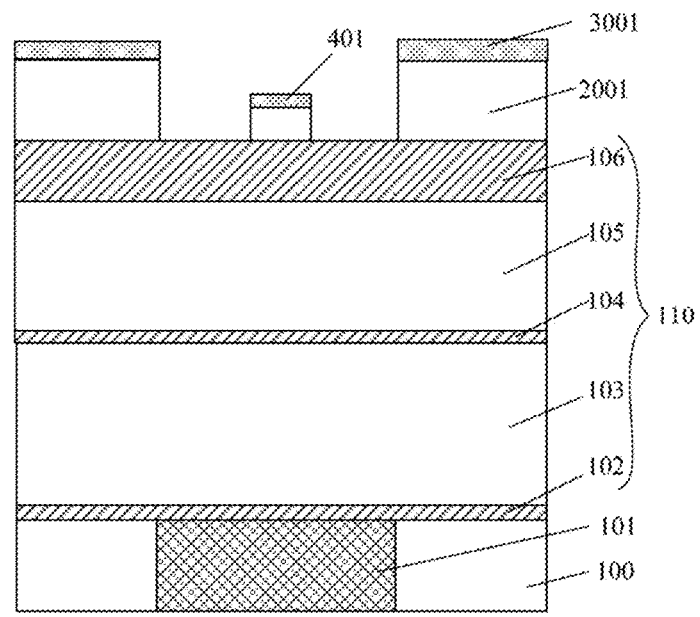

As shown in FIG. 5, an elective etching process is adopted to etch the second mask layer 300 on both sides of the doped area 401 at the bottom of the concave portion 201 (please refer to FIG. 4) and to further form a second patterned mask layer 3001; the first mask layer 200 (please refer to FIG. 4) is etched by using the second patterned mask layer 3001 as a mask to form a first patterned mask layer 2001.

The selective etching process adopted may be a wet etching process, and a suitable etching solution may be used for different materials of the second mask layer. In this specific embodiment, the second patterned mask layer 3001 is made of polysilicon, and the etching solution used includes at least one of APM solution, ammonia water and potassium hydroxide solution. The wet etching process has higher etching selectivity for the areas with low doping density in the second mask layer 300, so as to remove part of the areas on both sides of the doped area 401 and expose the first mask layer 200; and the wet etching process continues to etch the first mask layer 200 to form a first patterned mask layer 2001.

In other embodiments, the selective etching process may also be the dry etching process, and the etching gas used includes at least one of $CF_4$, $SF_6$ and HBr, for example both CF4 and HBr are used as the etching gas.

The dry etching process is used to etch the first mask layer 200, and the etching gas used includes $C_XF_Y\backslash CH_XF_Y$ and Ar with both X and Y are integers greater than or equal to 1.

Figure 6A:
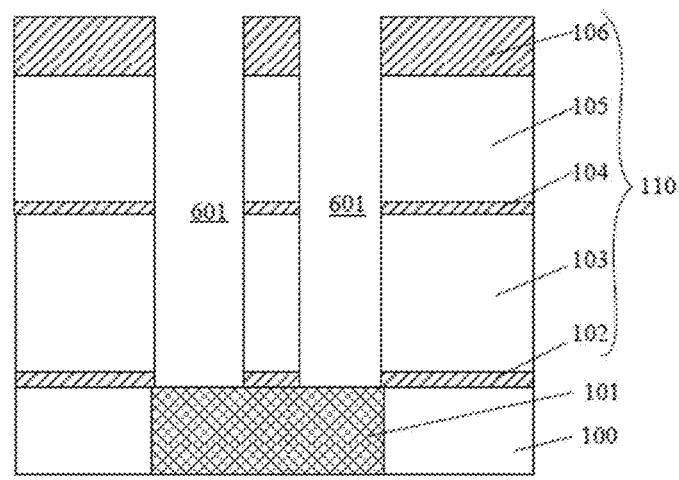
Figure 6B:
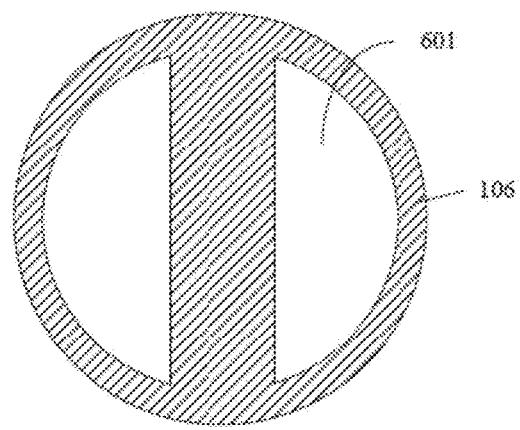

As shown in FIG. 6A and FIG. 6B, the dielectric layer 110 is etched to the surface of the electrical contact portion 101 by using the second patterned mask layer 3001 (please refer to FIG. 5) and the first patterned mask layer 2001 (please refer to FIG. 5) as masks, so as to form two capacitor holes 601. FIG. 6B is a top-view schematic diagram of the area where the capacitor holes 601 are.

The dielectric layer 110 is etched by using the dry etching process, and different etching gases are used for different material layers in the dielectric layer 110. The first supporting layer 102, the second supporting layer 104 and the third supporting layer 106 are made of silicon nitride, and the etching gas used includes at least one of $CF_4$, $SF_6$ and HBr; the first sacrificial layer 103 and the second sacrificial layer 105 are made of silicon oxide, and the etching gas used includes $SF_6$ and $O_2$.

In this specific embodiment, given that the cross section of the electrical contact portion 101 is circular and the cross section of the concave portion 201 (please refer to FIG. 4) is also circular, the outer sidewalls of the capacitor holes 601 formed are arc-shaped.

The width of the doped area 401 (please refer to FIG. 5) can be adjusted through two ion implantation processes, so as to adjust the size of the capacitor holes 601. Since there is no need to make use of any photolithography process to limit the size of the capacitor holes 601, critical dimensions of the capacitor holes 601 are not limited by the photolithography process, which can further reduce process cost. A maximum width of the capacitor holes 601 may range from 16 nm to 21 nm; the height of the capacitor holes 601 may range from 800 nm to 1,600 nm; and the distance between adjacent capacitor holes 601 ranges from 30 nm to 50 nm. Since at least two capacitor holes are formed on a same electrical contact portion in this embodiment, which has greatly improved integration of the capacitor, the capacitor holes in this embodiment may be in a larger size to reduce process difficulties as long as the requirements on integration of capacitors are met.

The first patterned mask layer 2001 and the second patterned mask layer 3001 can be removed by peeling, grinding and other means, and can also be consumed in the process of forming the capacitor holes 601.

In some embodiments, the method of forming the at least two capacitor holes may include: forming a mask layer on the surface of the dielectric layer, patterning the mask layer to form at least two openings in the mask layer above the electrical contact portion, etching the dielectric layer along the openings to the surface of the electrical contact portion, and forming the capacitor holes. The method of patterning the mask layer comprises: performing a doping process on the mask layer to form first portions and second portions arranged at intervals in the mask layer, with the first portions and the second portions having different doping densities and with at least two first portions or two second portions in the mask layer above the electrical contact portion; selectively removing first portions or second portions in the mask layer above the electrical contact portion; and patterning the mask layer. In some embodiments, patterning the mask layer comprises: etching the mask layer and forming a concave portion in the mask layer, with the concave portion located above the electrical contact portion; performing doping process on the concave portion to form first portions and second portions arranged at intervals in the concave portion, with the first portions and the second portions having different doping densities and with at least two first portions or two second portions in the concave portion; selectively removing first portions or second portions in the concave portion and patterning the mask layer.

In some embodiments, the method of forming the at least two capacitor holes comprises: forming a first mask layer on the surface of the dielectric layer, etching the first mask layer, forming a concave portion in the first mask layer with the concave portion located above the electrical contact portion, forming a second mask layer covering the inner surface of the concave portion and the surface of the first mask layer, patterning the second mask layer, forming at least two openings in the second mask layer at the bottom of the concave portion, etching the dielectric layer to the surface of the electrical contact portion along the openings, and forming the capacitor holes. Patterning the second mask layer comprises: performing doping process on the second mask layer to form first portions and second portions arranged at intervals in the second mask layer, with the first portions and the second portions having different doping densities and with at least two first portions or two second portions in the second mask layer above the electrical contact portion; selectively removing first portions or second portions in the second mask layer above the electrical contact portion; and patterning the second mask layer.

Figure 7A:
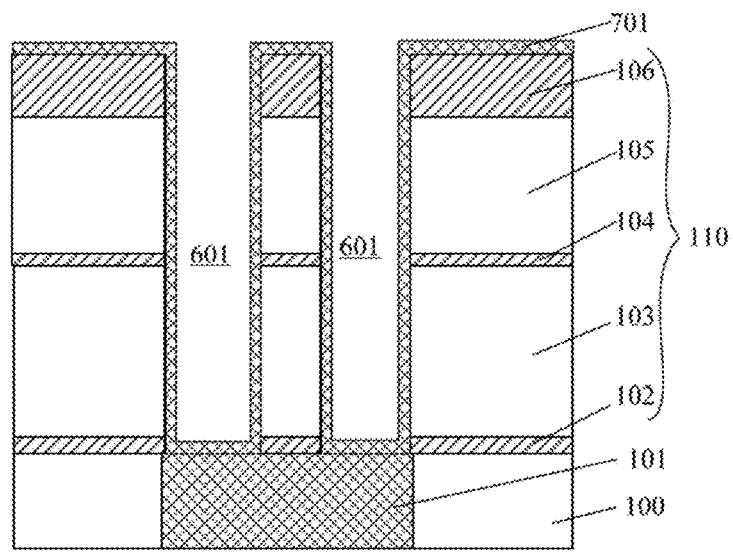
Figure 7B:
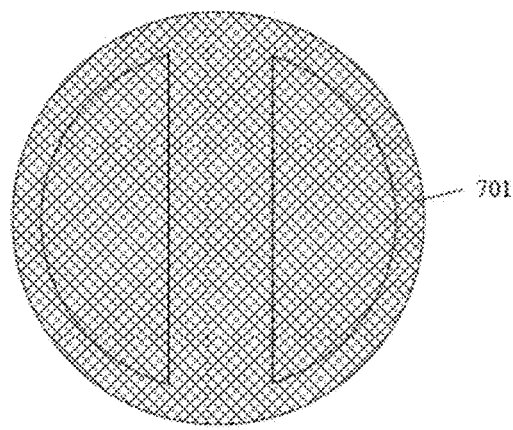

As shown in FIG. 7A and FIG. 7B, a lower electrode layer 701 covering inner walls of the two capacitor holes 601 and the surface of the dielectric layer 110 is formed.

The lower electrode layer 701 may be formed by using the atomic layer deposition process, the physical vapor deposition process, the plasma vapor deposition process or any other deposition process. In this embodiment, the lower electrode layer 701 covers the sidewall and bottom of the capacitor holes 601 and the top surface of the dielectric layer 110. The lower electrode layer 701 is made of titanium nitride, tantalum nitride, copper, tungsten or any other metal material.

Figure 8:
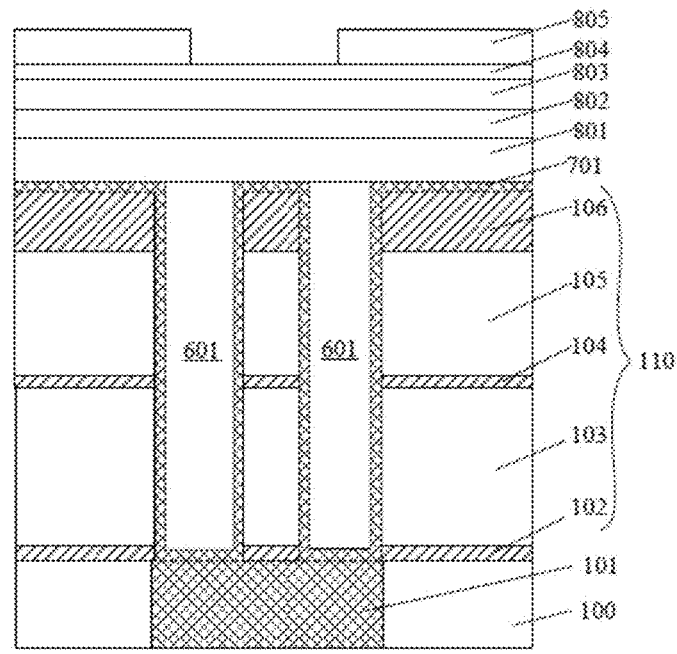

As shown in FIG. 8, a third mask layer is formed on the surface of the dielectric layer 110, and a patterned photoresist layer 805 is formed on the surface of the third mask layer.

The third mask layer closes the capacitor holes 601. In this embodiment, the third mask layer includes a silicon nitride layer 801, a silicon oxide layer 802, a cushion layer 803 and an anti-reflection layer 804. The pattern of the patterned photoresist layer 805 defines the position and shape of the openings to be formed subsequently. In this specific embodiment, the pattern of the patterned photoresist layer 805 is in circular shape. In other specific embodiments, it may also be in any other shape.

Figure 9A:
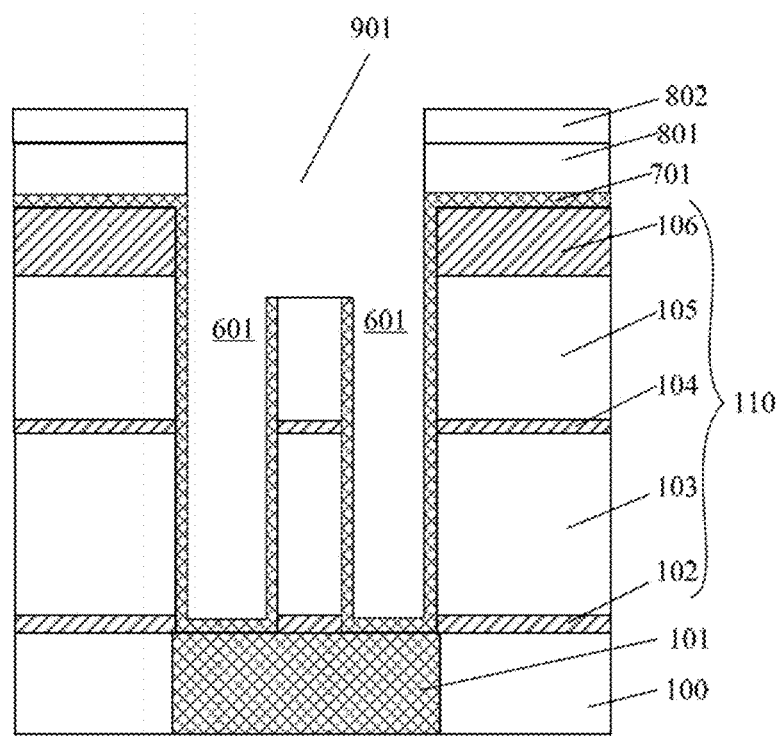
Figure 9B:
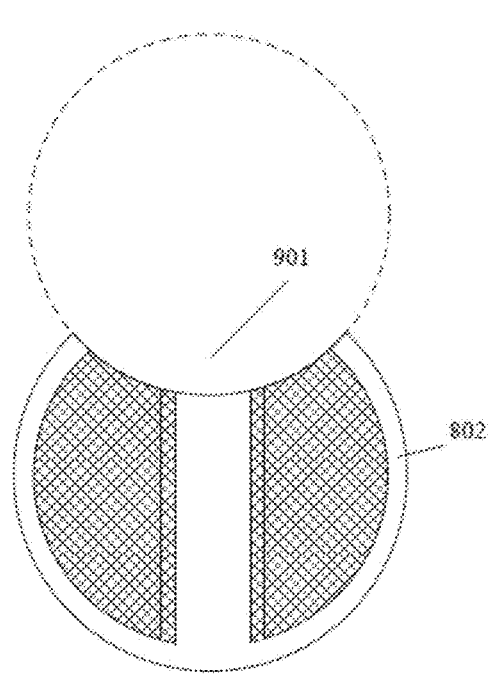

As shown in FIG. 9A and FIG. 9B, the third mask layer is etched to form a third patterned mask layer by using the photoresist layer 805 (please refer to FIG. 8) as a mask; the dielectric layer 110 is etched to form an opening 901 exposing at least part of sacrificial layers by using the third patterned mask layer as a mask.

The patterned photoresist layer 805 (please refer to FIG. 8), the anti-reflection layer 806 (please refer to FIG. 8) and the cushion layer 803 (please refer to FIG. 8) are consumed in the process of etching the dielectric layer 110.

The opening 901 is partially located on the electrical contact portion 101, overlaps the two capacitor holes 601, and at least laterally expose the two capacitor holes 601. Only the part of the opening 901 that is above the electrical contact portion 101 is shown in FIG. 9B.

Since only a part of the capacitor holes 601 overlap the opening 901, a part of supporting layers is reserved around each capacitor hole 601 to ensure the structural stability of the lower electrode layer 701 in the subsequent process of removing sacrificial layers.

Figure 10A:
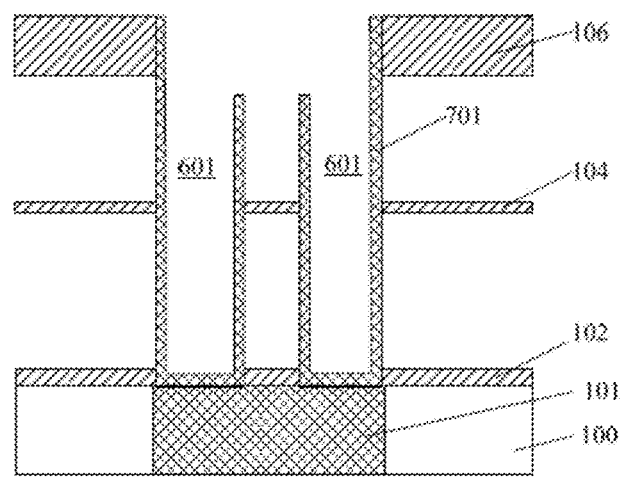
Figure 10B:
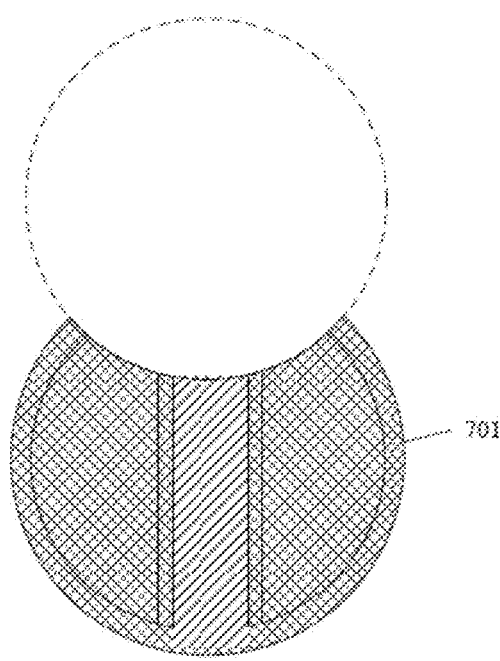

As shown in FIG. 10A and FIG. 10B, the first sacrificial layer 103 (please refer to FIG. 9A) and the second sacrificial layer 105 (please refer to FIG. 9A) are removed along the opening 901 to expose part of the sidewall of the lower electrode layer 701 covering the sidewall of the capacitor holes 601.

A wet etching process is used to remove the first sacrificial layer 103 and the second sacrificial layer 105. The etching solutions that can be used in the wet etching process include hydrofluoric acid solution, and since the corrosion rate of sacrificial layers is much greater than that of supporting layers, the supporting layers are almost fully reserved when the sacrificial layers are completely removed.

The sacrificial layers may be removed along the opening 901 after a silicon nitride layer 801 and a silicon oxide layer 802 are removed. The silicon nitride layer 801 and the silicon oxide layer 802 can be removed by using the chemical mechanical polishing process. In this specific embodiment, the lower electrode layer on the surface of the dielectric layer 110 is removed at the same time.

Figure 11:
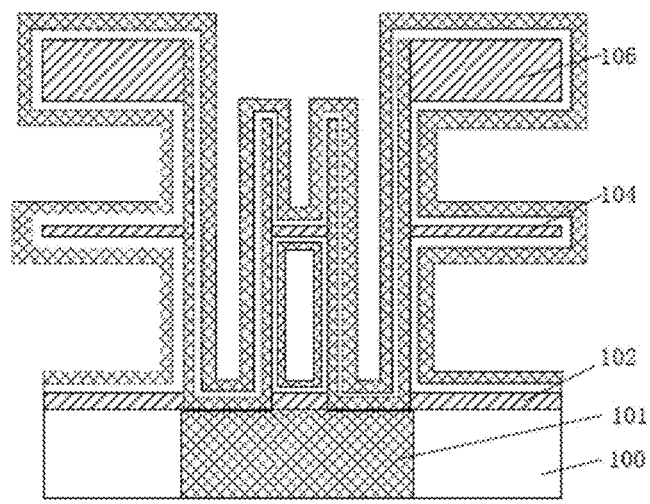

As shown in FIG. 11, a capacitor dielectric layer 1101 and an upper electrode layer 1102 are formed successively on the inner and outer surfaces of the lower electrode layer 701.

The capacitor dielectric layer 1101 may be made of high-K dielectric materials to increase capacitance value per unit area of the capacitor, including any one of $ZrO_x$, $HfO_x$, $ZrTiO_x$, $RuO_x$, $SbO_x$ and $AlO_x$ or any stack formed by any more than two of those materials.

An upper electrode layer 1102 covering the outer surface of the capacitor dielectric layer 1101 is formed by using the atomic layer deposition process, the plasma vapor deposition process, the sputtering process or any other process, with the upper electrode layer 1102 formed including a compound containing one or two of metal nitrides and metal silicides, such as titanium nitride, titanium silicide, TiSixNy or other conductive materials.

A conductive filling layer, such as a silicon germanium layer doped with boron, may be subsequently formed on the surface of the upper electrode layer 1102. The conductive filling layer fills the gap between the upper electrode layers 1102.

The above formation method of capacitors involves forming at least two capacitor holes on one electrical contact portion to form at least two double-sided capacitor structures on one electrical contact portion, which increases the capacitance value per unit area.

Various embodiments may also provide a capacitor.

Please refer to FIG. 11 which is a schematic diagram of capacitor described in one specific embodiment of the present invention.

The capacitor is composed of: a substrate 100 in which an electrical contact portion 101 is formed; a lower electrode layer 701 which includes at least two sub-electrode layers arranged at intervals, with the bottom of the sub-electrode layers connected to the electrical contact portion 101; a capacitor dielectric layer 1101 on the inner and outer surfaces of the lower electrode layer; and an upper electrode layer 1102 on the surface of the capacitor dielectric layer 1101.

In some specific embodiments, both the capacitor dielectric layer 1101 and the upper electrode layer 1102 are continuous material layers.

In some specific embodiments, the cross section of the sub-electrode layers is U-shaped, and the bottom of the U-shaped cross section is on the surface of the electrical contact portion 101.

In some specific embodiments, the distance between the U-shaped cross sections of the two sub-electrode layers ranges from 30 nm to 50 nm.

In some specific embodiments, the capacitor is further composed of a support structure between the sub-electrode layers arranged at intervals on whose inner and outer surfaces the capacitor dielectric layer 1101 and the upper electrode layer 1102 are formed successively.

In this embodiment, the support structure at least includes: a first supporting layer 102, a second supporting layer 104 and a third supporting layer 106, the three of which are on the substrate 100 and are connected to the lower electrode layer 701. Specifically, the third supporting layer 106 is at the periphery of the opening of the lower electrode layer 701, the second supporting layer 104 is at the middle periphery of the lower electrode layer 701 and between the two sub-electrode layers, and the first supporting layer 102 is formed on the surface of the substrate 100 and is at the bottom periphery of the lower electrode layer 701 and between the sub-electrode layers. The capacitor dielectric layer 1101 also covers the surfaces of the first supporting layer, the second supporting layer and the third supporting layer.

Since the integration of capacitors is greatly improved by forming at least two capacitor holes on a same electrical contact portion in this embodiment, the height of capacitor holes can be appropriately reduced to avoid capacitors from collapsing as long as the requirements on integration of capacitors are met. Accordingly, the number of supporting layers in the support structure can also be appropriately reduced, for example, to only the first supporting layer 102 and the second supporting layer 104.

Various embodiments also provide a DRAM cell which is composed of multiple capacitors as described in the above specific embodiments and a transistor with a source area and a drain area, with the transistor being placed in the substrate and the capacitors being in contact with the source area or the drain area through the electrical contact portion.

Figure 12:
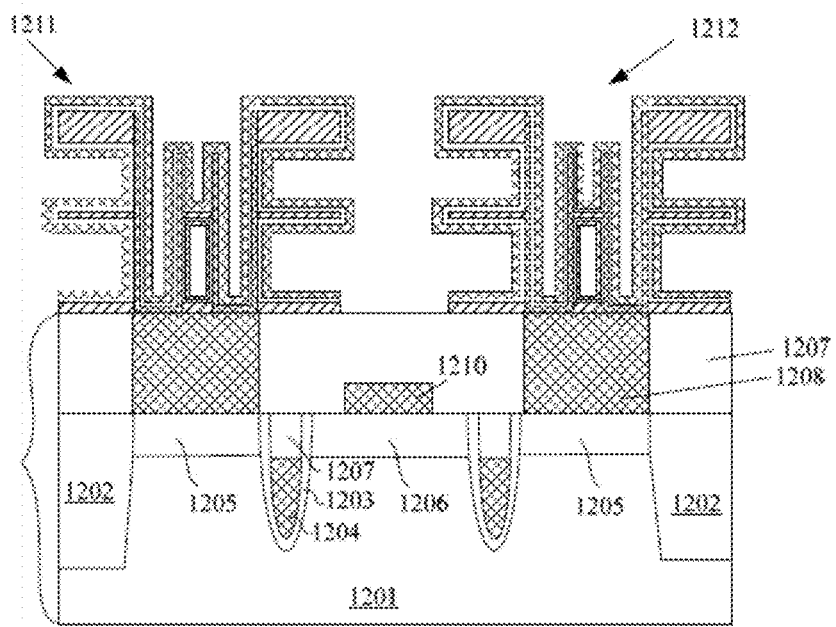
FIG. 12 is a schematic diagram of a DRAM cell as described in a specific embodiment of the present invention.

As shown in FIG. 12, the substrate 1200 comprises a semiconductor substrate and a dielectric layer on the surface of the semiconductor substrate, with the semiconductor substrate being composed of an active area 1201 and an isolation structure 1202. The isolation structure 1202 may be a shallow trench isolation structure which is placed around the active area 1201. In the active area, a transistor is formed which has a buried gate structure and is composed of a gate 1204 buried in the active area 1201, a gate dielectric layer between the gate and the active area 1201, and a source area 1205 and a drain area 1206 on both sides of the gate 1204. In this specific embodiment, two gates 1204 are formed in the active area 1201 with the drain area 1206 located between the two gates 1204, and the source area 1205 is located outside the two gates 1204. An insulating (dielectric) layer 1207 is formed on the top of the gate 1204, which is flush with the surface of the active area 1201.

An interconnection structure is formed in the dielectric layer 1207 on the surface of the semiconductor substrate, which is used for electrical connections with the transistor in the semiconductor substrate. A first electrical contact portion 1208 connected to the source area 1205 is formed in the dielectric layer 1207, and a second electrical contact portion 1210 connected to the drain area 1206 is also formed in the dielectric layer 1207 for connections to bit lines (not shown in accompanying drawings).

In this embodiment, the DRAM cell further includes a capacitor with its lower electrode connected to the first electrical contact portion 1208. In this embodiment, two capacitors, i.e. a capacitor 1211 and a capacitor 1212, are formed on the active area, and are respectively connected to the source area 1205 of the transistor through the first electrical contact portion 1208.

For structure of the capacitor 1211 and the capacitor 1212, please refer to the above embodiments with no more details described here. Since a single capacitor has two double-sided capacitor structures, capacitance value of the single capacitor is increased and storage density of the DRAM cell is increased accordingly.

In other embodiments, the capacitor may also be connected to the drain of transistor.

In this embodiment, the transistor is a transistor in the buried gate structure. In other specific embodiments, the transistor may also be a transistor in the planar gate structure or the ring gate structure, which is not limited herein.

This embodiment also provides a memory which includes a memory array formed by the DRAM cells aforementioned. In each DRAM cell of the memory, each capacitor has two double-sided capacitor structures, which helps to increase capacitance value of a single capacitor and further increase storage density of the memory.

Although the present invention has been disclosed as above in various embodiments, it should be noted that those skilled in the art may make improvements and modifications to the present invention without departing from the principle of the present invention, and all those improvements and modifications made thereby should be also deemed to fall within the protection scope of the present invention.

What is claimed is:

1. A capacitor formation method comprises:
providing a substrate, an electrical contact portion being formed on the substrate;
forming alternately stacked supporting layers and sacrificial layers on a surface of the substrate;
forming at least two capacitor holes penetrating the sacrificial layers and the supporting layers and exposing the electrical contact portion, wherein the at least two capacitor holes are provided on the same electrical contact portion;
forming a lower electrode layer covering an inner surface of the capacitor holes,
the lower electrode layer being connected to the electrical contact portion;
removing the sacrificial layers; and
forming a capacitor dielectric layer and an upper electrode layer successively on inner and outer surfaces of the lower electrode layer and on the surface of the supporting layers;
wherein forming the at least two capacitor holes comprises:

forming a mask layer on a surface of the alternately stacked supporting layers and sacrificial layers;

patterning the mask layer so that at least two openings are formed in the mask layer above the electrical contact portion;

etching the alternately stacked supporting layers and sacrificial layers to the surface of the electrical contact portion along the openings; and forming the capacitor holes;

wherein patterning the mask layer comprises:

performing a doping process on the mask layer to form first portions and second portions arranged at intervals in the mask layer, the first portions and the second portions having different doping densities and with at least two first portions or two second portions in the mask layer above the electrical contact portion;

selectively removing first portions or second portions in the mask layer above the electrical contact portion; and patterning the mask layer.

2. The capacitor formation method according to claim 1, wherein patterning the mask layer comprises:

etching the mask layer and forming a concave portion in the mask layer, the concave portion located above the electrical contact portion;

performing doping process on the concave portion to form first portions and second portions arranged at intervals in the concave portion, the first portions and the second portions having different doping densities and with at least two first portions or two second portions in the concave portion; and selectively removing first portions or second portions in the concave portion and patterning the mask layer.

3. The capacitor formation method to claim 2, wherein the doping process includes adopting two tilted and opposite ion implantation processes.

4. The capacitor formation method according to claim 3, wherein the tilt angle of the ion implantation processes ranges from 5 degrees to 45 degrees.

5. The capacitor formation method according to claim 1, wherein forming the at least two capacitor holes comprises:

forming a first mask layer on the surface of the alternately stacked supporting layers and sacrificial layers, etching the first mask layer, and forming a concave portion in the first mask layer with the concave portion located above the electrical contact portion;

forming a second mask layer covering the inner surface of the concave portion and the surface of the first mask layer;

patterning the second mask layer;

forming at least two openings in the second mask layer at a bottom of the concave portion;

etching the alternately stacked supporting layers and sacrificial layers to the surface of the electrical contact portion along the openings; and forming the capacitor holes.

6. The capacitor formation method according to claim 5, wherein patterning the second mask layer comprises:

performing a doping process on the second mask layer to form first portions and second portions arranged at intervals in the second mask layer, the first portions and the second portions having different doping densities and with at least two first portions or two second portions in the second mask layer above the electrical contact portion; and selectively removing first portions or second portions in the second mask layer; and patterning the second mask layer.

7. The capacitor formation method according to claim 6, wherein the doping process includes adopting two tilted and opposite ion implantation processes.

8. The capacitor formation method according to claim 7, wherein the tilt angle of the ion implantation processes ranges from 5 degrees to 45 degrees.

9. The capacitor formation method according to claim 5, wherein the size of the concave portion is less than or equal to the size of the electrical contact portion.

* * * * *